(12) United States Patent
Nara

(10) Patent No.: US 6,356,067 B1
(45) Date of Patent: Mar. 12, 2002

(54) WIDE BAND SIGNAL ANALYZER WITH WIDE BAND AND NARROW BAND SIGNAL PROCESSORS

(75) Inventor: Akira Nara, Tokyo (JP)

(73) Assignee: Sony/Tektronix Corporation, Tokyo (JP)

( * ) Notice: Subject to any disclaimer, the term of this patent is extended or adjusted under 35 U.S.C. 154(b) by 0 days.

(21) Appl. No.: 09/370,785

(22) Filed: Aug. 5, 1999

(30) Foreign Application Priority Data

Aug. 10, 1998 (JP) ............................. 10-226254
Aug. 24, 1998 (JP) ............................. 10-236838

(51) Int. Cl.[7] ...................... G01R 23/16; G01R 23/14; G01R 23/165; G01R 23/00; G01L 21/00

(52) U.S. Cl. .............................. 324/76.23; 324/76.21; 324/76.19; 324/76.45; 324/76.29; 704/201; 704/205

(58) Field of Search ..................... 324/76.23, 76.27, 324/76.19, 76.45, 76.29; 704/205, 201; 370/349

(56) References Cited

U.S. PATENT DOCUMENTS

| | | | | |
|---|---|---|---|---|
| 3,631,339 A | * | 12/1971 | Low ........................ 324/76.33 |
| 3,743,783 A | * | 7/1973 | Agnello ...................... 704/205 |
| 3,831,088 A | * | 8/1974 | Ort et al. .................. 324/76.29 |
| 3,876,946 A | * | 4/1975 | La Clair et al. ............... 702/77 |
| 3,984,769 A | * | 10/1976 | Williams et al. ........... 324/76.23 |
| 4,181,822 A | * | 1/1980 | Workman .................... 704/201 |
| 4,257,119 A | * | 3/1981 | Pitroda ....................... 370/358 |
| 4,535,286 A | * | 8/1985 | Sullivan, Jr. ............. 324/76.45 |
| 4,607,215 A | * | 8/1986 | Takano et al. ............ 324/76.23 |
| 4,639,911 A | * | 1/1987 | Roza et al. .................. 370/490 |
| 4,651,089 A | * | 3/1987 | Haigh ..................... 324/76.42 |
| 4,675,805 A | * | 6/1987 | Freymann .................... 700/42 |
| 4,839,582 A | * | 6/1989 | Fukaya et al. ........... 324/76.23 |
| 4,994,740 A | * | 2/1991 | Skudera, Jr. et al. ..... 324/76.19 |
| 5,061,930 A | * | 10/1991 | Nathanson et al. ........... 342/13 |
| 5,101,406 A | * | 3/1992 | Messenger .................. 370/349 |
| 5,130,796 A | * | 7/1992 | Isobe et al. ............... 375/240.2 |
| 5,301,134 A | * | 4/1994 | Maruyama .................. 708/313 |
| 5,424,631 A | * | 6/1995 | Ward ....................... 324/76.19 |

(List continued on next page.)

FOREIGN PATENT DOCUMENTS

| | | | |
|---|---|---|---|
| EP | 0 338 333 | 10/1989 | |
| EP | 0 439 157 | 7/1991 | |
| EP | 0 420 205 A2 | * 3/1992 | ............. H04N/9/79 |
| EP | 0701 320 A | * 3/1992 | ............. H03D/3/00 |
| EP | 0 556 398 A1 | * 8/1993 | ............. H01P/1/15 |
| JP | 11074866 | * 6/1998 | |

OTHER PUBLICATIONS

McTigue, Michael T. and Patrick J. Byrne, "An 8–Gigasample–per–Second, 8–Bit Data Acquistion System for a Sampling Digital Oscilloscope," *1266 Hewlett–Packard Journal*, 44 (1993) Oct., No. 5, Palo Alto, CA, US, pp. 11–23.

Elo, Mark A., "DECT Measurements with a Microwave Spectrum Analyzer," *1266 Hewlett–Packard Journal*, 44 (1993) Dec., No. 6, Palo Alto, CA, US, pp. 98–106.

*Primary Examiner*—Glenn W. Brown
*Assistant Examiner*—Wasseem H. Hamdan
(74) *Attorney, Agent, or Firm*—Smith-Hill and Bedell

(57) ABSTRACT

A wide band signal analyzer includes a frequency converter for converting a signal under test to an intermediate frequency signal. A narrow band signal processor receives the intermediate frequency signal and produces a first digital signal representing a first frequency band of the intermediate frequency signal and a wide band signal processor receives the intermediate frequency signal and produces a second digital signal representing a second frequency band of the intermediate frequency signal. A transfer rate decelerator decelerates the transfer rate of the second digital signal, and a digital processor processes selectively the first digital signal or the output signal of the transfer rate decelerator. A memory stores the processed output of the digital processor.

14 Claims, 2 Drawing Sheets

U.S. PATENT DOCUMENTS

| | | | |
|---|---|---|---|
| 5,530,373 A | | 6/1996 | Gibson et al. ............... 324/758 |
| 5,598,288 A | * | 1/1997 | Collar ........................ 359/173 |
| 5,706,385 A | * | 1/1998 | Suzuki et al. ................. 386/34 |
| 5,731,699 A | | 3/1998 | O'Byrne ................. 324/77.11 |
| 5,761,190 A | * | 6/1998 | Yamauchi et al. .......... 370/210 |
| 5,869,959 A | * | 2/1999 | Tomikawa ............... 324/72.27 |
| 5,974,098 A | * | 10/1999 | Tsuda ......................... 375/340 |
| 5,982,819 A | * | 11/1999 | Womack et al. ............ 375/316 |

* cited by examiner

WIDE BAND SIGNAL ANALYZER WITH WIDE BAND AND NARROW BAND SIGNAL PROCESSORS

FIELD OF THE INVENTION

The present invention relates to a wide band signal analyzer, especially, to a wide band signal analyzer suitable for analyzing the frequency domain of a signal under test.

BACKGROUND OF THE INVENTION

FIG. 1 shows a schematic block diagram of a conventional signal analyzer for analyzing the frequency domain of a signal under test. A frequency converter 10 which has a mixer and a local oscillator etc. converts a signal under test into an IF (Intermediate Frequency) signal. A band pass filter (BPF) 12 makes the IF signal have a suitable bandwidth. An IF amplifier 14 amplifies the output signal of the BPF 12 and an analog to digital converter (ADC) 16 converts it into a digital signal. A digital signal processor (DSP) 18 transforms the output signal of the ADC 16 into the frequency domain data by the FFT process. A memory 20 sequentially stores the frequency domain data.

A trigger detector 21 detects whether the frequency domain data satisfies a predetermined trigger condition or not. That is, the trigger detector 21 compares the data that specify the trigger condition with the frequency domain data of the signal under test and generates a trigger signal if the trigger condition is satisfied. The trigger condition may be specified by an operator selecting a zone in a measuring region on a display screen (not shown), on which the horizontal and vertical axes indicate frequency and amplitude respectively, as the trigger condition.

When the trigger condition is satisfied, a memory controller 23 controls the storage operation of the memory 20 according to the trigger signal generation. In more detail, it can control the time during which the memory 20 continues the storage operation after the time of the trigger generation. If the memory 20 stops the storage operation soon after the trigger signal generation, it is able to store the data received before the time of the trigger signal generation. This operation provides a pre-trigger function. On the other hand, if the memory 20 stops the storage operation after continuing the storage for some period after the trigger signal generation, it stores the data mainly after the time of the trigger signal generation. This provides a post-trigger function. The data stored in the memory 20 in such a way as described above are used to display a waveform of frequency versus amplitude on a suitable display device like a cathode ray tube or a liquid crystal display etc. for frequency domain analysis of the signal. With suitable processing, the data may also be used to create an eye pattern display or a constellation display.

Some modern communication systems use a wider band and operate at a higher speed than before, and instruments using microprocessors, such as personal computers and HDTVs, operate at higher clock frequencies than before. Consequently, it is now desirable that the frequency span of the signal under test be wider. It is, however, difficult for a signal analyzer having the conventional configuration shown in FIG. 1 to realize the wider band analysis. This is because it is necessary to increase the bandwidth of the IF amplifier and the sampling frequency of the ADC in order to increase the bandwidth of the band pass filter. Then it is also necessary to increase the operating speed of the DSP, the data transfer rate and the operating speed of the memory. These measures degrade the performance of the analyzer by making the analyzer sensitive to disturbance or noise etc. and by impairing the spurious response characteristics, i.e. the characteristics where the displayed frequency is not the same as the input frequency, and also increase the cost of the analyzer. It is very difficult to realize the event trigger functions as described above for the wider frequency measurement.

Therefore what is desired is to provide a new type signal analyzer at low cost while reducing the degradation of performance characteristics arising from making the frequency band wider.

What is further desired is to provide a low cost signal analyzer with useful event trigger functions for signal measurement of the wide frequency band.

SUMMARY OF THE INVENTION

The present invention provides a wide band signal analyzer suitable for analyzing the frequency domain of a signal under test at low cost while reducing the degradation of performance characteristics.

In an embodiment of the invention, a frequency converter converts a signal under test into an intermediate frequency signal. A narrow band signal processor receives the intermediate frequency signal for producing a first digital signal representing a first frequency band of the intermediate frequency signal. The narrow band signal processor may have a conventional configuration and is used for measuring the narrow band side.

This controls noise caused by the frequency band being wider and keeps the degradation of spurious response characteristics to a minimum.

A wide band signal processor receives the intermediate frequency signal for producing a second digital signal representing a second frequency band, which is wider than the first frequency band and includes the first frequency band. The devices used in both the narrow band and wide band signal processors can be selected to be optimum for the particular band, which is advantageous from technical and economical viewpoints.

A transfer rate decelerator decelerates the transfer rate of the second digital signal so that the following devices do not need to be capable of high speed operation. In a preferred embodiment, a selecting means selects the first digital signal or the output signal of the transfer rate decelerator and a digital processor processes the output signal of the selecting means by some process such as the FFT process. A memory stores the processed output of the digital processor. The data in the memory means can be used for displaying the measurement result or another analysis.

A trigger detector detects whether the output signal of the digital processor satisfies a predetermined trigger condition. A control means controls the transfer rate decelerator according to the output signal of the trigger detector if the measurement frequency band of the signal under test is wider than the first frequency band. In this case, the output signal of the processor is derived from the narrow band signal processor for detecting whether it satisfies the predetermined trigger condition. Therefore the trigger function concerning the wide bandwidth is realized by the slight modification relative to the conventional narrow one.

BRIEF DESCRIPTION OF THE DRAWINGS

For a better understanding of the invention, and to show how the same may be carried into effect, reference will now be made, by way of example, to the accompanying drawings, in which.

DESCRIPTION OF PREFERRED EMBODIMENTS OF THE INVENTION

Figure 1:
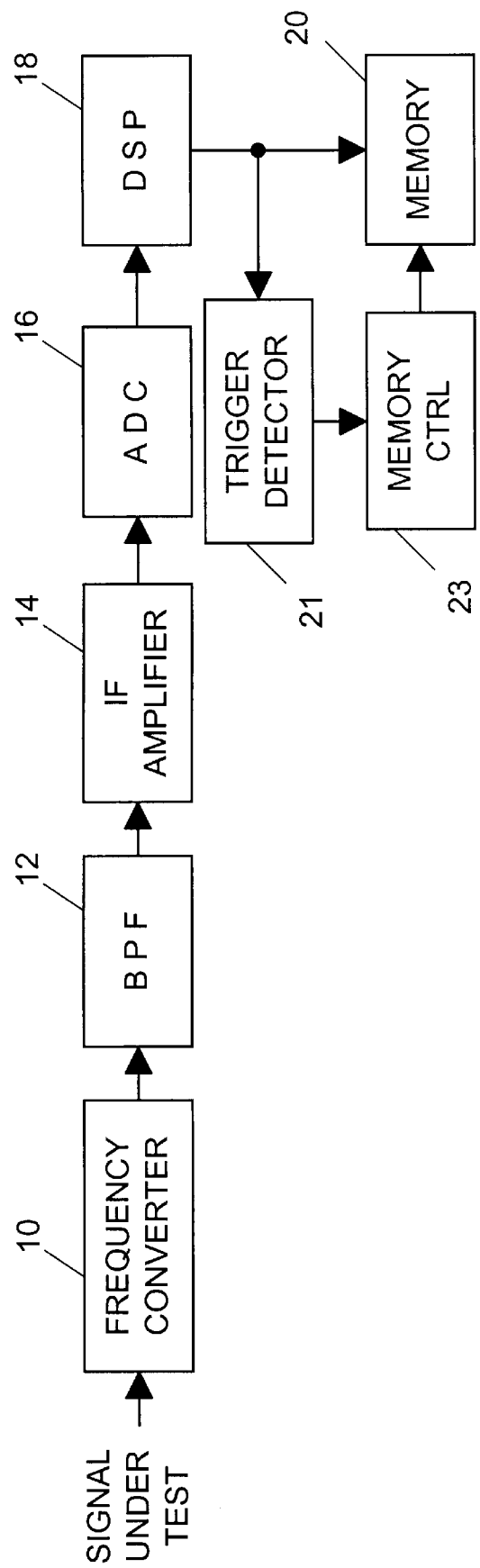
FIG. 1 shows a schematic block diagram of a conventional signal analyzer.
Figure 2:
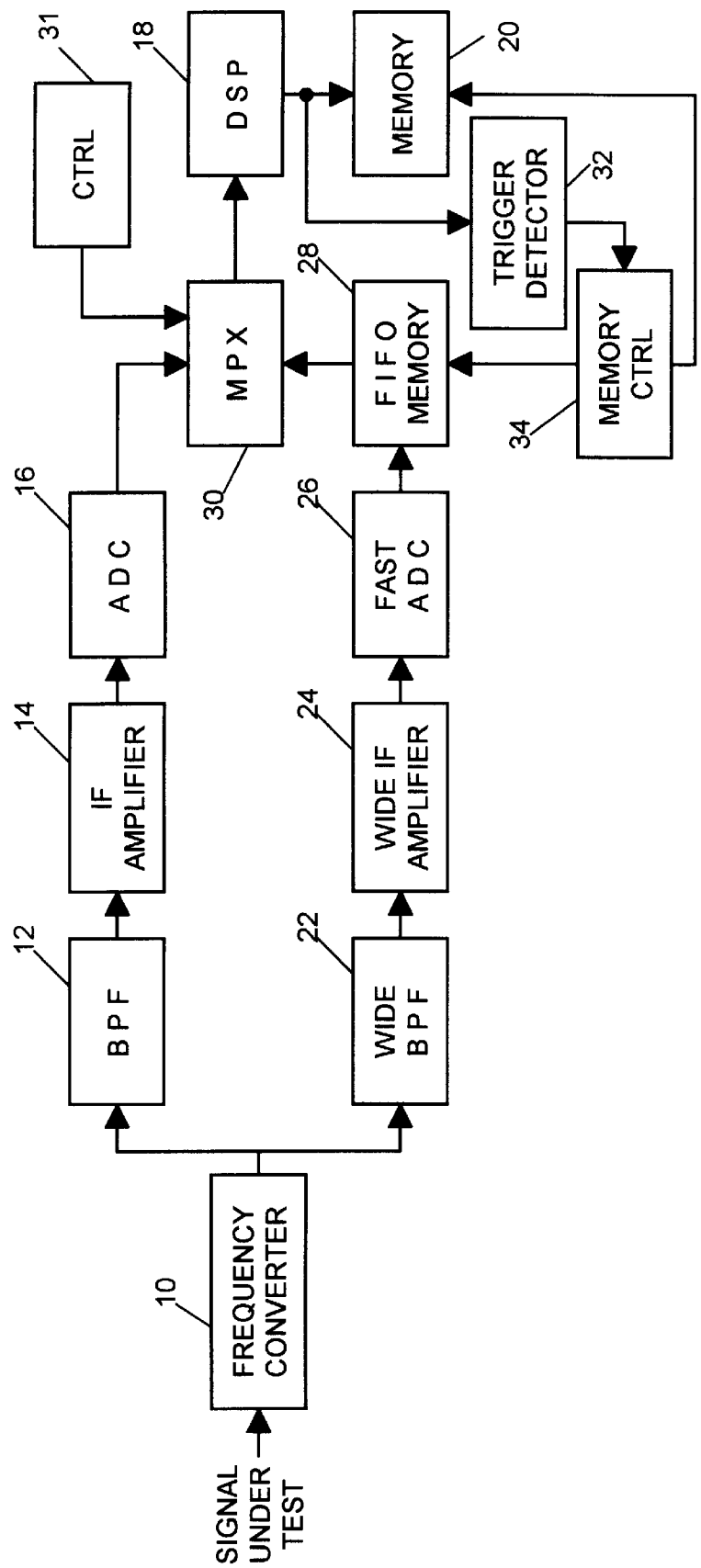
FIG. 2 shows a schematic block diagram of one preferred embodiment according to the present invention.

FIG. 2 shows a schematic block diagram of one preferred embodiment according to the present invention. The elements corresponding to those of FIG. 1 have the same reference characters, respectively. A frequency converter 10 converts a signal under test into a suitable IF (intermediate frequency) signal. The frequency converter 10 may include a mixer and a local oscillator etc., as is usual. In the frequency conversion, a signal having a frequency range 200 MHz to 220 MHz may be mixed with a local oscillator signal having a frequency of 250 MHz to produce a signal including the frequency ranges 30 MHz to 50 MHz and 450 MHz to 470 MHz, for example. The frequency converter 10 provides the IF signal to a band pass filter (BPF) 12. The BPF 12 could be a filter similar to the conventional one as shown in FIG. 1, and has a narrow band pass width, such as 5 MHz. The BPF 12 can be the input of a signal path for a narrow band side of the signal analyzer. The output of the BPF 12 is connected to an IF amplifier 14 and the output of the IF amplifier 14 is connected to an ADC (analog to digital converter) 16 as usual. This signal path of the narrow band side, having the BPF 12, the IF amplifier 14 and the ADC 16, is the same as the conventional one shown in FIG. 1.

The frequency converter also provides the IF signal to a wide band pass filter 22. The wide BPF 22 has a wider bandwidth than the BPF 12, such as 30 MHz, and can be the input of a signal path for a wide band side. Therefore the output signal of the wide BPF 22 has a wider bandwidth than of the output signal of the BPF 12. The center frequencies of the two pass bands may be the same. In the case of the example mentioned, the center frequency could be, e.g. 40 MHz, in which case the pass band of the BPF 12 would be 37.5 MHz to 42.5 MHz and the pass band of the wide BPF would be 25 MHz to 55 MHz. The pass band of the wide BPF 22 contains the pass band of the narrow BPF 12. A wide band IF amplifier 24 appropriately amplifies the output signal of the wide BPF 22 and a fast ADC 26 converts it into a digital signal. The sampling theorem as is well known to those skilled in the art states that the sampling frequency in the analog to digital conversion must be at least twice the maximum frequency of the analog input signal. Then the sampling frequency of the fast ADC 26 should be two or more times the maximum frequency of the output signal of the wide IF amplifier 24. Consequently, the transfer rate of the output data of the fast ADC 26 is higher than that of the ADC 16 in the narrow band side.

A FIFO (First In First Out) memory 28 stores the output data of the fast ADC 26 sequentially. The FIFO 28 provides sequential storage and read out of the data produced by the wide band signal processor. If the FIFO memory 28 become full before the storage operation stops, it stores the most recent data and deletes the oldest data. The speed of reading data from the FIFO can be lower than the speed of data storage to the FIFO, so the FIFO memory 28 works as a data transfer decelerator. This allows the data transfer rate of the output data of the FIFO memory 28 to match that of the ADC 16.

A multiplexer (MPX) 30 receives the output signals of both the ADC 16 and the FIFO memory 28 and selects one of them. A DSP (digital signal processor) 18 receives the output signal of the multiplexer 30 and performs a necessary process, such as FFT, similar to the conventional one. If the DSP 18 conducts the FFT process, it produces the frequency domain data corresponding to the output data of the multiplexer 30. A memory 20 stores the output data of the DSP 18. The data stored in the memory 20 could be used for displaying the measurement result on a display (not shown), such as a CRT, or for another analysis.

The DSP 18 provides the output data to a trigger detector 32 as well as to the memory 20. The trigger detector 32 compares the frequency domain data from the DSP 18 with data specifying a preset trigger condition and generates a trigger signal if the trigger condition is satisfied. The memory controller 34 receives the trigger signal and controls the memory 20 and/or the FIFO memory 28 according to the trigger signal.

In use of the analyzer, the operator selects the narrow band or wide band for processing, and a controller 31 controls operation of the multiplexer 30 in the manner described below.

If the operator selects a relatively narrow bandwidth for analysis, the memory controller 34 controls the storage operation of the memory 20 for the trigger function, and the operation is the same as that of the conventional analyzer shown in FIG. 1. The analyzer realizes the pre-trigger and post-trigger functions as described above. In this case, the FIFO memory 28 is not used.

On the contrary, if the operator selects a wider bandwidth for analysis, the memory controller 34 controls the storage operation of the FIFO memory 28, containing the digital data produced by the wide band signal processor. The memory controller 34 controls the data remaining in the FIFO memory according to the trigger function, such as pre-trigger or post-trigger function, with reference to the trigger signal generated by the trigger detector 32 based on the frequency domain data acquired by the narrow band signal processor. Then the control of the FIFO memory 28 realizes an effective event trigger operation in the wide band signal process. In this case, the memory 20 may store the data derived from the output signal of the ADC 16 via the DSP 18.

By the way, it is a remarkable point that the frequency domain data used for detecting a trigger event are the data produced by the narrow band processor. In other words, the trigger detector 32 detects the trigger by using the frequency domain data acquired in the narrow band signal processor, while the memory controller 34 controls the data produced in the wide band signal processor and stored in the FIFO memory 28 or the data produced in the narrow band signal processor and stored in the memory 20, depending on whether the operator has selected a wide bandwidth or a narrow bandwidth for analysis. Therefore the signal analyzer shown in FIG. 2 can realize the trigger functions, such as the pre-trigger function and the post-trigger function, with slight modification relative to the analyzer shown in FIG. 1 and with the minimum cost increase while it also realizes the wide band signal processing. Of course, it can also easily realize the pre-trigger and post-trigger functions as usual event trigger functions by controlling the storage operation of the FIFO memory 28.

When the FIFO memory 28 has completed storage of the data acquired in the wide band signal processing, for example in a pre-trigger function, the multiplexer 30 selects the data read out from the FIFO memory 28 and provides them to the DSP 18. The DSP 18 transforms the data by the FFT process to produce the frequency domain data of the wide band signal process. The memory 20 stores the frequency domain data of the wide band signal process, which are used for displaying the measurement result on the CRT etc. or for another analysis. The data previously stored in the memory 20 from the narrow band processor may be transferred to another memory, such as a magnetic disk, if the memory 20 has insufficient capacity. By the way, the trigger function need not be used. For example, in the roll mode of operation the data are continuously acquired from the narrow band signal processing path or the wide band signal processing path and displayed. In the event that the wide band signal processing path is selected for the roll mode, it may be necessary to suspend acquisition of data from time to time because of the decelerated data output.

As described above, a wide band signal analyzer according to the present invention uses the signal path for the narrow band side, which is of construction similar to the conventional analyzer for the narrow bandwidth measurement. Therefore it does not cause the spurious characteristics worse or noise because of the wider band. Both the signal paths of the narrow and wide band sides can be constructed from the devices, such as filters, amplifiers and ADCs, respectively, that are optimum for the measurement band, which is favorable from technical and economical view points. Because the analyzer employs the FIFO memory 28 for decelerating the data transfer rate of the output data of the fast analog to digital converter, the operation speed of the DSP 18 or memory 20 can be slow, which minimizes the cost increase. It can easily realize an event trigger function in the wide band signal process with slight modification relative to the conventional one and with the minimum cost increase.

It will be appreciated that the invention is not restricted to the particular embodiment that has been described, and that variations may be made therein without departing from the scope of the invention as defined in the appended claims and equivalents thereof.

What is claimed is:

1. A wide band signal analyzer comprising:
   a frequency converter for converting a signal under test to an intermediate frequency signal,
   a narrow band signal processor for receiving the intermediate frequency signal and producing a first digital signal representing a first frequency band of the intermediate frequency signal,
   a wide band signal processor for receiving the intermediate frequency signal and producing a second digital signal representing a second frequency band of the intermediate frequency signal,
   a transfer rate decelerator for decelerating the transfer rate of the second digital signal,
   a digital processor for processing selectively the first digital signal or the output signal of the transfer rate decelerator, and
   a memory for storing the processed output of the digital processor.

2. A wide band signal analyzer according to claim 1, wherein the narrow band signal processor includes a band pass filter for passing said first frequency band of the intermediate frequency signal, and an analog to digital converter for converting the output signal of the band pass filter to produce the first digital signal.

3. A wide band signal analyzer according to claim 2, wherein the narrow band signal processor includes an intermediate frequency amplifier between the output of the band pass filter and the input of the analog to digital converter.

4. A wide band signal analyzer according to claim 1, wherein the wide band signal processor includes a wide band pass filter for passing the second frequency band of the intermediate frequency signal, and a fast analog to digital converter for converting the output signal of the wide band pass filter to produce the second digital signal.

5. A wide band signal analyzer according to claim 4, wherein the wide band signal processor includes a wide band intermediate frequency amplifier between the output of the wide band pass filter and the input of the fast analog to digital converter.

6. A wide band signal analyzer according to claim 1, wherein the transfer rate decelerator includes a FIFO memory for sequentially storing the output signal of the wide band signal processor and of which the read out rate is slower than the storage rate.

7. A wide band signal analyzer according to claim 1, wherein the digital processor selects the first digital signal for processing if the measurement frequency band of the signal under test is within said first frequency band and selects the output signal of the transfer rate decelerator if the measurement frequency band of the signal under test is wider than the first frequency band.

8. A wide band signal analyzer according to claim 1, wherein the digital processor includes a selector for selecting the first digital signal or the output signal of the transfer rate decelerator and a digital signal processor for processing the signal selected by the selector.

9. A wide band signal analyzer according to claim 1, wherein the digital processor performs a Fast Fourier Transform process for producing the frequency domain data of the selected signal.

10. A wide band signal analyzer according to claim 1, further comprising:
    a controller for controlling the transfer rate decelerator according to the output signal of the trigger detector if the measurement frequency band of the signal under test is wider than the first frequency band.

11. A wide band signal analyzer according to claim 10, wherein the second frequency band includes the first frequency band and the output signal of the digital processor is derived from the narrow band signal processor for detecting whether it satisfies the predetermined trigger condition.

12. A wide band signal analyzer according to claim 10, wherein the transfer rate decelerator temporarily stores the second digital signal and the controller is operable to adjust the interval between the time that occurrence of the trigger condition is detected and the time at which storing of the second digital signal by the transfer rate decelerator terminates.

13. A wide band signal analyzer according to claim 10, wherein the transfer rate decelerator temporarily stores the second digital signal and if the transfer rate decelerator becomes full before the storage operation terminates, it stores the most recent data and deletes the oldest data.

14. A wide band signal analyzer according to claim 10, wherein the wide band signal processor includes a wide band pass filter for passing the second frequency band of the intermediate frequency signal, and a fast analog to digital converter for converting the output signal of the wide band pass filter to produce the second digital signal and said transfer rate decelerator includes a FIFO memory sequentially storing the output signal of the fast analog to digital converter, of which read out rate is slower than the storage rate.

* * * * *